US009448126B2

(12) United States Patent
Dehe et al.

(10) Patent No.: US 9,448,126 B2
(45) Date of Patent: Sep. 20, 2016

(54) SINGLE DIAPHRAGM TRANSDUCER STRUCTURE

(71) Applicant: Infineon Technologies AG, Neubiberg (DE)

(72) Inventors: Alfons Dehe, Reutlingen (DE); Christoph Glacer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 272 days.

(21) Appl. No.: 14/198,609

(22) Filed: Mar. 6, 2014

(65) Prior Publication Data
US 2015/0253208 A1 Sep. 10, 2015

(51) Int. Cl.
*G01L 1/14* (2006.01)
*G01L 9/00* (2006.01)
*G01R 29/12* (2006.01)

(52) U.S. Cl.
CPC ............... *G01L 1/14* (2013.01); *G01L 9/0042* (2013.01); *G01L 9/0073* (2013.01); *G01R 29/12* (2013.01)

(58) Field of Classification Search
CPC ...... G01L 1/14; H04R 19/00; H04R 19/0005
See application file for complete search history.

(56) References Cited

U.S. PATENT DOCUMENTS

| | | | | |
|---|---|---|---|---|
| 3,559,491 A * | 2/1971 | Thoen | ................... | G01N 1/2258 73/863.21 |
| 4,279,142 A * | 7/1981 | McIntyre | ........... | G01N 33/0006 73/1.06 |
| 4,856,352 A * | 8/1989 | Daum | ................... | G01N 1/2247 73/1.06 |
| 5,103,212 A * | 4/1992 | Notarianni | ............. | G08B 17/10 340/628 |
| 5,259,247 A * | 11/1993 | Bantien | ................. | G01L 9/0073 361/283.1 |
| 5,477,218 A * | 12/1995 | Manmoto | ............ | G08B 17/107 250/574 |
| 5,844,148 A * | 12/1998 | Klein | ................... | G01N 1/2226 73/863.82 |
| 5,959,188 A * | 9/1999 | Deutsch | ............. | G01N 33/0006 340/515 |
| 6,425,297 B1 * | 7/2002 | Sharp | ....................... | G01N 1/26 73/863.33 |
| 6,985,081 B2 * | 1/2006 | Wagner | .................. | G08B 17/10 169/60 |
| 7,375,642 B2 * | 5/2008 | Siemens | ............... | G08B 17/10 340/628 |
| 7,402,425 B2 * | 7/2008 | Weinberg | ......... | G01N 33/54373 204/282 |
| 7,661,290 B2 * | 2/2010 | Gu | ...................... | G01N 33/0006 73/1.01 |
| 7,912,236 B2 * | 3/2011 | Dehe | .................... | H04R 19/005 29/594 |
| 8,087,307 B2 * | 1/2012 | Gauthier | .............. | G01N 1/2202 73/863.23 |
| 8,412,481 B2 * | 4/2013 | Knox | ....................... | G01N 1/26 701/100 |
| 8,617,960 B2 * | 12/2013 | Denison | ................. | H04R 19/04 216/17 |
| 9,148,726 B2 * | 9/2015 | Dehe | .................... | G01L 9/0016 |
| 2002/0115198 A1 * | 8/2002 | Nerenberg | ............ | B06B 1/0292 435/287.2 |

(Continued)

FOREIGN PATENT DOCUMENTS

| | | | | |
|---|---|---|---|---|
| DE | EP 2464142 A2 * | 6/2012 | ............. | H04R 1/005 |
| DE | EP 2582156 A2 * | 4/2013 | ........... | H04R 19/013 |

(Continued)

*Primary Examiner* — Lisa Caputo
*Assistant Examiner* — Punam Roy
(74) *Attorney, Agent, or Firm* — Viering, Jentschura & Partner mbB

(57) ABSTRACT

A transducer structure including a carrier with an opening and a suspended structure mounted on the carrier which extends at least partially over the opening in the carrier is disclosed. The transducer structure may further include configuring the suspended structure to provide an electrostatic field between the suspended structure and the carrier by changing a distance between the suspended structure and the carrier. Alternatively, the suspended structure may be configured to change the distance between the suspended structure and the carrier in response to an electrostatic force provided between the suspended structure and the carrier.

17 Claims, 9 Drawing Sheets

(56) References Cited

U.S. PATENT DOCUMENTS

| | | | | |
|---|---|---|---|---|
| 2002/0135440 A1* | 9/2002 | Ryhanen | H03H 7/0115 | 333/185 |
| 2005/0146241 A1* | 7/2005 | Wan | H02N 1/006 | 310/309 |
| 2005/0241944 A1* | 11/2005 | Dehe | B81B 3/001 | 205/75 |
| 2006/0076648 A1* | 4/2006 | Gally | B81B 3/007 | 257/619 |
| 2007/0008157 A1* | 1/2007 | Siemens | G08B 17/10 | 340/577 |
| 2007/0084286 A1* | 4/2007 | Ajay | G01F 1/667 | 73/597 |
| 2007/0214862 A1* | 9/2007 | Kubinski | F01N 13/008 | 73/1.06 |
| 2010/0067728 A1* | 3/2010 | Chen | H04R 1/406 | 381/361 |
| 2010/0194575 A1* | 8/2010 | Rodriguez | G08B 29/145 | 340/628 |
| 2011/0150261 A1* | 6/2011 | Ho | H01G 5/011 | 381/361 |
| 2012/0248554 A1* | 10/2012 | Klein | B81B 3/0072 | 257/416 |
| 2012/0283807 A1* | 11/2012 | Deterre | A61N 1/3975 | 607/116 |
| 2012/0319217 A1* | 12/2012 | Dehe | B81B 3/0072 | 257/415 |
| 2013/0010990 A1* | 1/2013 | Sridharan | H04R 19/005 | 381/175 |
| 2013/0121509 A1 | 5/2013 | Hsu et al. | | |
| 2013/0221453 A1* | 8/2013 | Dehe | H04R 19/005 | 257/415 |
| 2015/0021722 A1* | 1/2015 | Dehe | H04R 19/005 | 257/416 |

FOREIGN PATENT DOCUMENTS

| | | | |
|---|---|---|---|
| JP | 2003163998 A | 6/2003 | |
| KR | 20130112795 A | * 10/2013 | ........... H04R 19/005 |

* cited by examiner

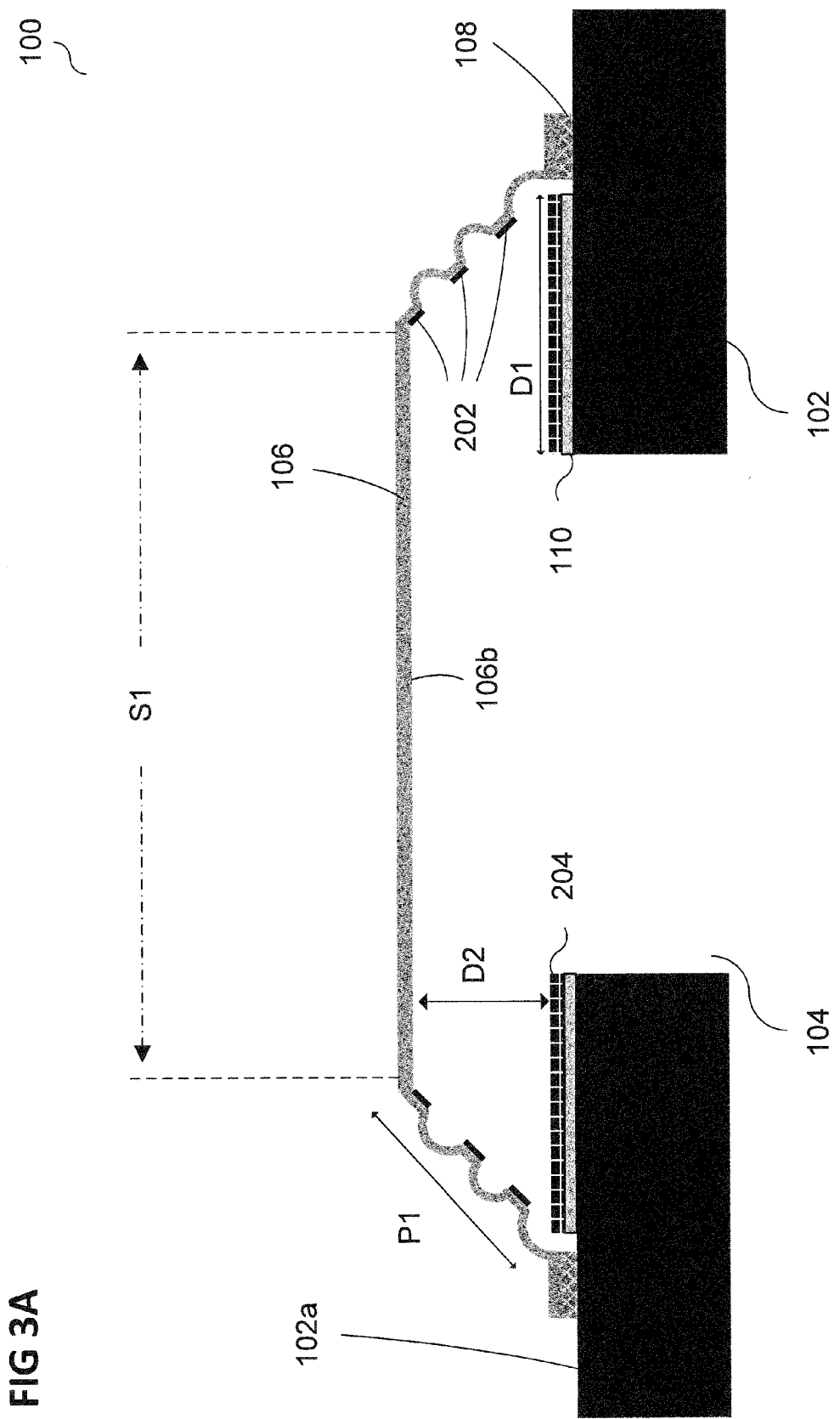

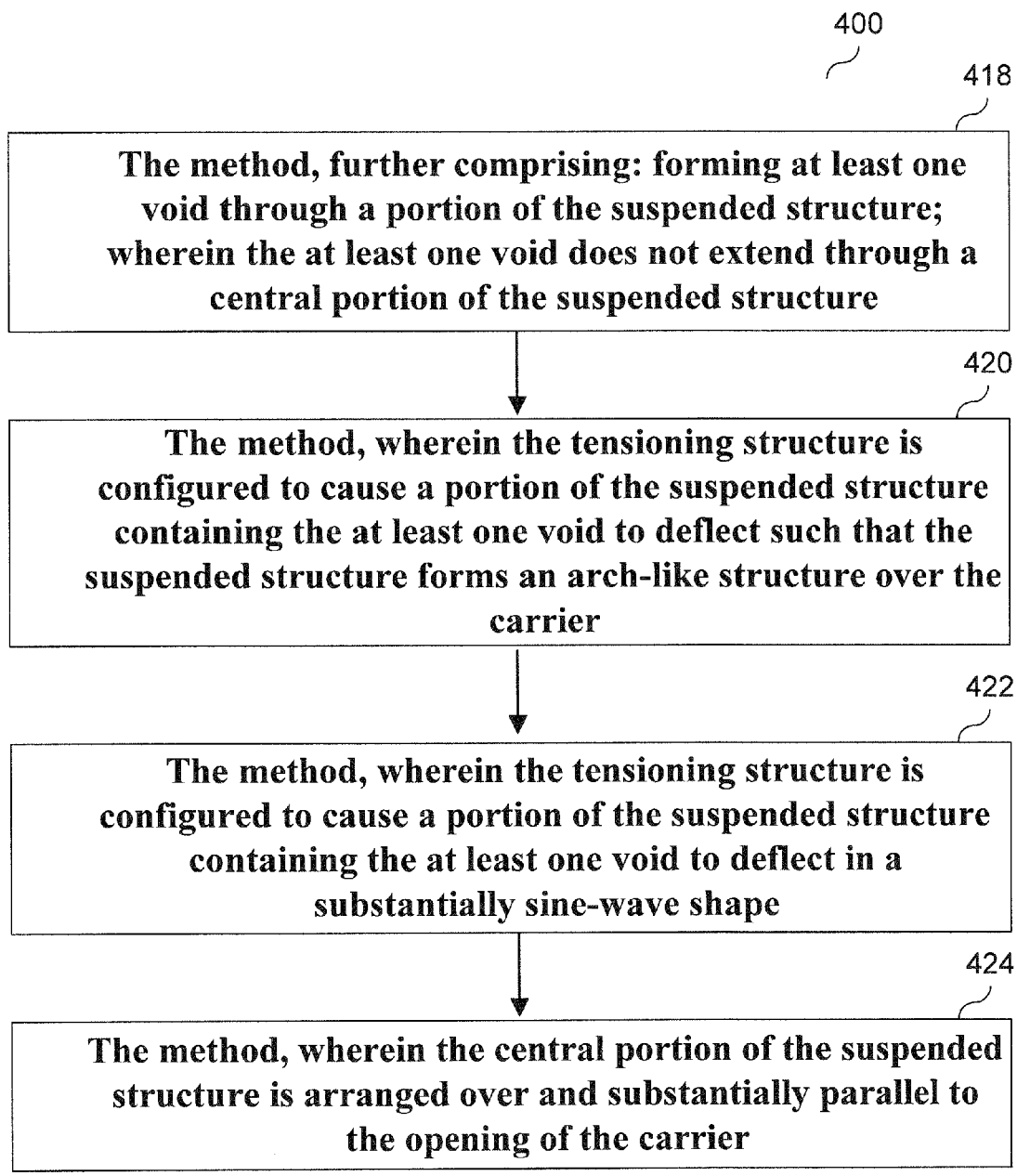

SINGLE DIAPHRAGM TRANSDUCER STRUCTURE

TECHNICAL FIELD

Various embodiments relate generally to a transducer structure which may include a diaphragm structure and may be capable of generating and/or measuring a given electrostatic field.

BACKGROUND

Many conventional transducers convert a membrane motion into a voltage proportional to the size of the diaphragm deflection. Often, the sensitivity of these transduction systems is limited by level of signal interference in the form of electrical noise from various sources. In a conventional condenser microphone, for example, a few sources of signal interference may include one or more of the following: the size of the sound inlet opening in the microphone housing; the air flow through the capacitor gap; and the impedance of the converter circuit system.

SUMMARY

In various embodiments, a transducer structure is provided. The transducer structure may include a carrier having an opening and a suspended structure mounted on the carrier and extending at least partially over the opening of the carrier. The suspended structure may be configured to provide an electrostatic field between a portion of the suspended structure and the carrier by changing a distance between the suspended structure and the carrier; or the suspended structure may be configured to change the distance between the suspended structure and the carrier in response to an electrostatic force provided between a portion of the suspended structure and the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A shows a cross-sectional representation of a transducer structure in accordance with various embodiments;

FIGS. 4A-4C show a flow chart representation of a method which may be used to construct a transducer structure in accordance with various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, a diaphragm may include a plate or a membrane. A plate may be understood as being a diaphragm being under pressure. Furthermore, a membrane may be understood as being a diaphragm being under tension. Although various embodiments will be described in more detail below with reference to a membrane, it may be alternatively provided with a plate, or in general with a diaphragm.

Figure 1A:
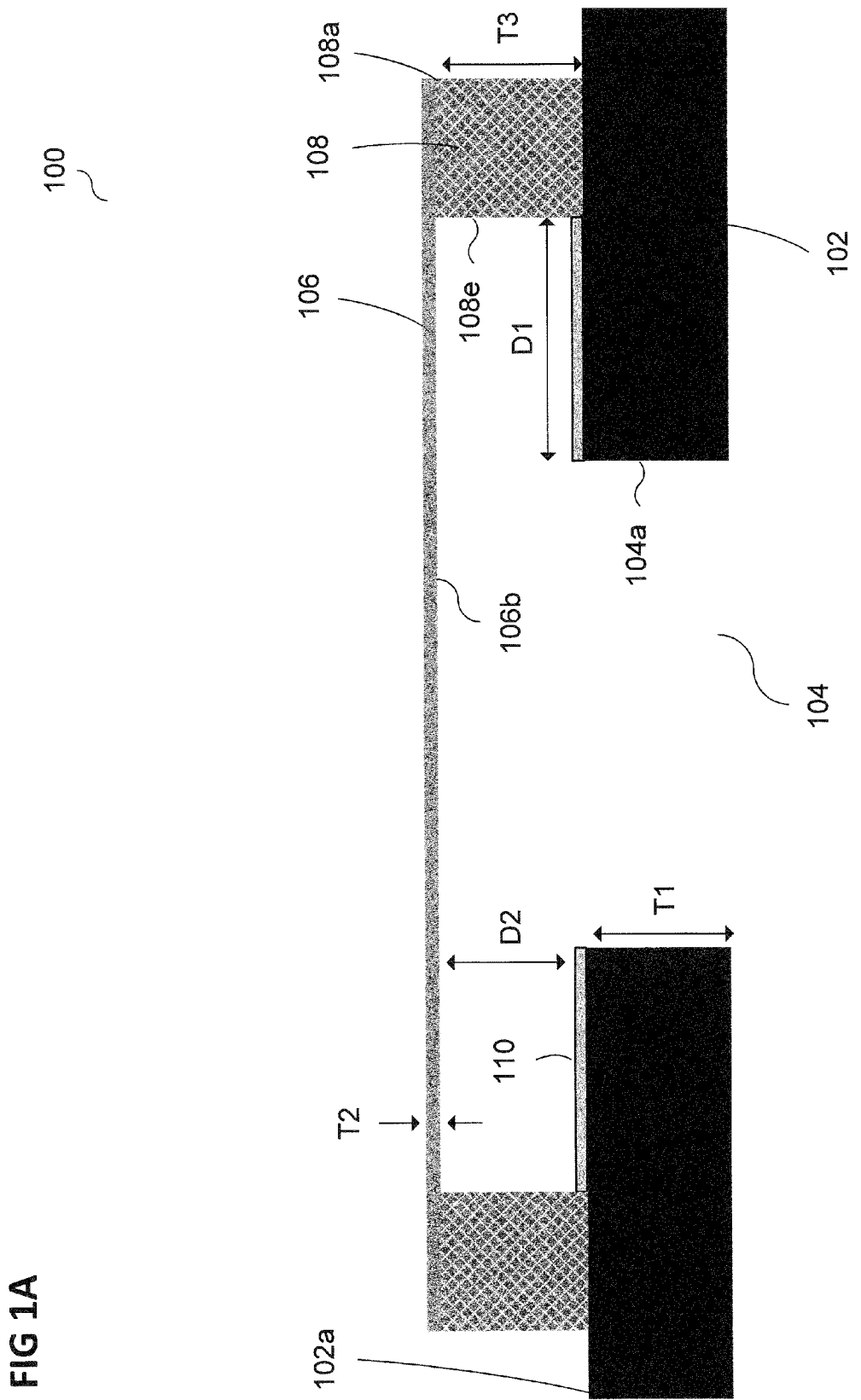
FIG. 1A shows a cross-sectional representation of a transducer structure in accordance with various embodiments.
Figure 1B:
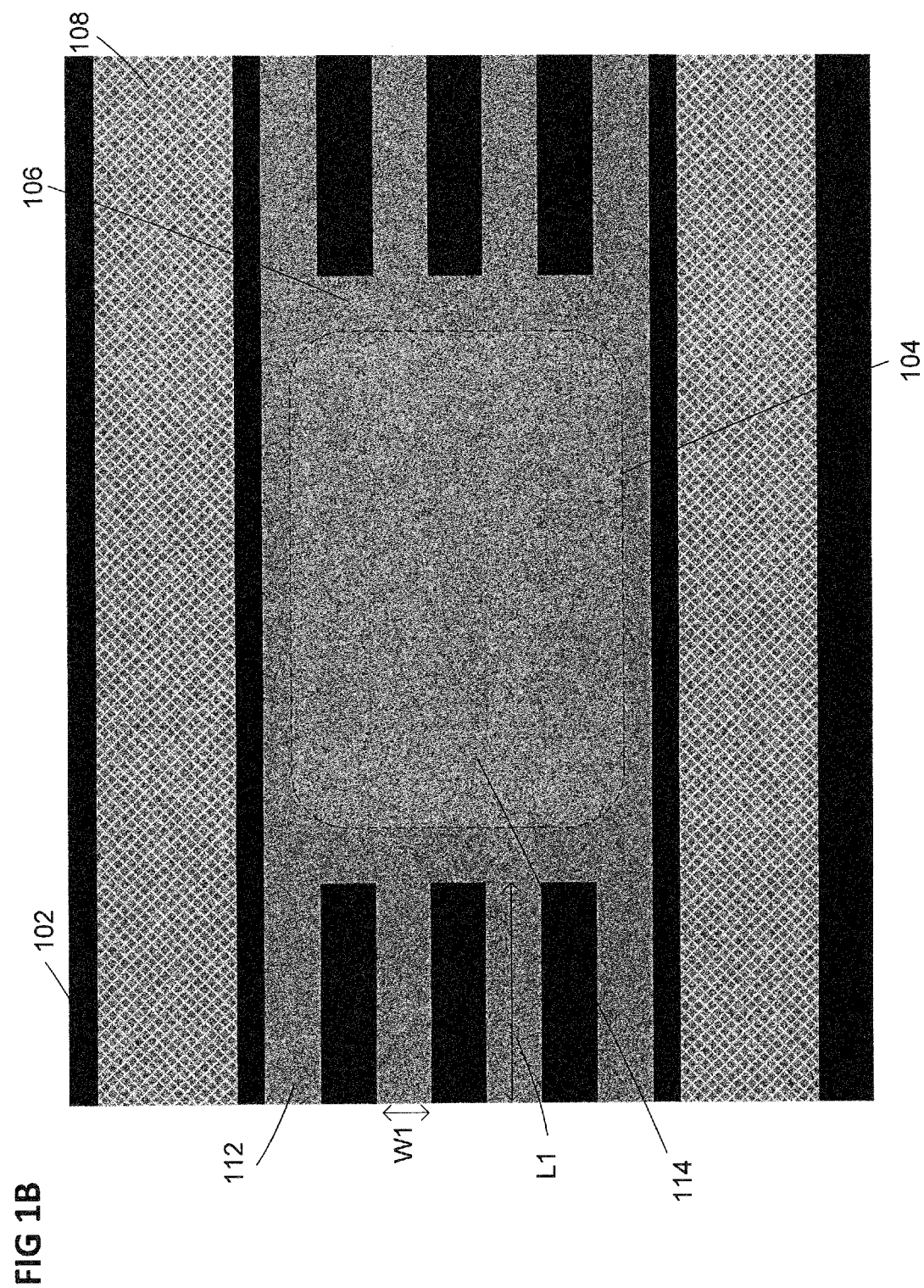
FIG. 1B shows an overhead representation of the transducer structure represented in FIG. 1A.

According to various embodiments, as illustrated in FIGS. 1A and 1B, a transducer structure 100 is disclosed. The transducer structure 100 may include a carrier 102 having an opening 104, and a suspended structure 106 mounted on the carrier 102 and extending at least partially over the opening 104 of the carrier 102. According to various embodiments, the suspended structure 106 may be mounted on the carrier 102 by a mounting structure 108. In various embodiments, the mounting structure 108 may be implemented as a plurality of mounting structures.

According to various embodiments, the carrier 102 may be a semiconductor substrate, such as a silicon substrate. The carrier 102 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. The carrier 102 may include or essentially consist of other materials or combinations of material, for example various dielectrics, metals, and polymers as may be desirable for a given application. The carrier 102 may include or essentially consist of, for example, glass, and/or various polymers. The carrier 102 may be a silicon-on-insulator (SOI) structure. The carrier 102 may be a printed circuit board. The carrier 102 may have a thickness T1 in the range from about 100 µm to about 700 µm, e.g. in the range from about 150 µm to about 650 µm, e.g. in the range from about 200 µm to about 600 µm, e.g. in the range from about 250 µm to about 550 µm, e.g. in the range from about 300 µm to about 500 µm, e.g. in the range from about 350 µm to about 450 µm. The carrier 102 may have a thickness T1 of at least about 100 µm, e.g. of at least 150 µm, e.g. of at least 200 µm, e.g. of at least 250 µm, e.g. of at least 300 µm. The carrier 102 may have a thickness T1 of less than or equal to about 700 μm, e.g. of less than or equal to 650 μm, e.g. of less than or equal to 600 μm, e.g. of less than or equal to 550 μm, e.g. of less than or equal to 500 μm.

According to various embodiments, the opening 104 may formed in the carrier 102 by means of various techniques, e.g. deep reactive-ion etching, isotropic gas phase etching, vapor etching, wet etching, isotropic dry etching, plasma etching, laser drilling, various grinding techniques, etc. The opening 104 may be square or substantially square in shape. The opening 104 may be rectangular or substantially rectangular in shape. According to various embodiments, the opening 104 may be a circle or substantially circular in shape. The opening 104 may be an oval or substantially oval in shape. According to various embodiments, the opening 104 may be a triangle or substantially triangular in shape. The opening 104 may be a cross or substantially cross shaped. According to various embodiments, the opening 104 may be formed into any shape that may be desired for a given application. According to various embodiments, the opening 104 may be implemented as a hole which completely perforates at least a portion of the carrier 102. According to various embodiments, the opening 104 may be implemented as a recess on a surface of the carrier 102.

According to various embodiments, the suspended structure 106 may include or essentially consist of a semiconductor material such as, e.g. silicon. According to various embodiments, the suspended structure 106 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The suspended structure 106 may include or essentially consist of at least one of a metal, a dielectric material, a piezoelectric material, a piezoresistive material, and a ferroelectric material. According to various embodiments, the suspended structure 106 may be implemented as a membrane structure.

According to various embodiments, the suspended structure 106 may have a thickness T2 in the range from about 100 nm to about 1 μm, e.g. in the range from about 150 nm to about 900 nm, e.g. in the range from about 200 nm to about 800 nm, e.g. in the range from about 250 nm to about 700 nm, e.g. in the range from about 300 nm to about 600 nm, e.g. in the range from about 350 nm to about 500 nm, e.g. in the range from about 400 nm to about 450 nm. The suspended structure 106 may have a thickness T2 of at least about 100 nm, e.g. of at least about 150 nm, e.g. of at least about 200 nm, e.g. of at least about 250 nm, e.g. of at least about 300 nm, e.g. of at least about 350 nm, e.g. of at least about 400 nm. The suspended structure 106 may have a thickness T2 of less than or equal to about 1 μm, e.g. of less than or equal to about 900 nm, e.g. of less than or equal to about 800 nm, e.g. of less than or equal to about 700 nm, e.g. of less than or equal to about 600 nm, e.g. of less than or equal to about 500 nm, e.g. of less than or equal to about 450 nm.

According to various embodiments, the suspended structure 106 may be formed over a top surface 108a of the mounting structure 108 by means of various fabrication techniques, e.g. physical vapor deposition, electrochemical deposition, chemical vapor deposition, and molecular beam epitaxy or the like.

According to various embodiments, the mounting structure 108 may be formed over at least a portion of a top surface 102a of the carrier 102 by means of various fabrication techniques, e.g. physical vapor deposition, electrochemical deposition, chemical vapor deposition, and molecular beam epitaxy or the like. At least a portion of the mounting structure 108 may be arranged between a bottom surface 106b of the suspended structure 106 and the top surface 102a of the carrier 102. In other words, the mounting structure 108 may support the suspended structure. According to various embodiments, the mounting structure 108 may be configured to electrically isolate the suspended structure 106 from the carrier 102.

According to various embodiments, the mounting structure 108 may include or essentially consist of various dielectrics, such as, for example, a silicon oxide, silicon nitride, tetraethyl orthosilicate, borophosphosilicate glass, and various plasma oxides. According to various embodiments, the mounting structure 108 may have a thickness, T3, in the range from about 1 μm to about 300 μm, e.g. in the range from about 10 μm to about 250 μm, e.g. in the range from about 25 μm to about 200 μm, e.g. in the range from about 50 μm to about 150 μm, e.g. in the range from about 75 μm to about 100 μm. In various embodiments, the mounting structure 108 may have a thickness of at least about 1 μm, e.g. of at least about 10 μm, e.g. of at least about 25, e.g. of at least about 50 μm, e.g. of at least about 75 μm. In various embodiments, the mounting structure 108 may have a thickness of less than or equal to about 300 μm, e.g. of less than or equal to about 250 μm, e.g. of less than or equal to about 200 μm, e.g. of less than or equal to about 150 μm, e.g. of less than or equal to about 100 μm.

According to various embodiments, a conductive layer 110 may be formed over a portion of the carrier 102. The conductive layer 110 may be formed over a portion of the top surface 102a of the carrier 102. The conductive layer 110 may be arranged on a portion of the top surface 102a of the carrier 102 which may be demarcated by the mounting structure 108 and the opening 104. According to various embodiments, a distance, D1, between an inner edge 108e of the mounting structure 108 and an edge 104a of the opening 104 may be in the range from about 1 μm to about 300 μm, e.g. in the range from about 10 μm to about 250 μm, e.g. in the range from about 25 μm to about 200 μm, e.g. in the range from about 50 μm to about 150 μm, e.g. in the range from about 75 μm to about 100 μm. In various embodiments, the distance D1 may be at least about 1 μm, e.g. at least about 10 μm, e.g. at least about 25 μm, e.g. at least about 50 μm, e.g. at least about 75 μm. In various embodiments, the distance D1 may be less than or equal to about 300 μm, e.g. less than or equal to about 250 μm, e.g. less than or equal to about 200 μm, e.g. less than or equal to about 150 μm, e.g. less than or equal to about 100 μm.

The conductive layer 110 may be square or substantially square in shape. The conductive layer 110 may be rectangular or substantially rectangular in shape. According to various embodiments, the conductive layer 110 may be a circle or substantially circular in shape. The conductive layer 110 may be an oval or substantially oval in shape. According to various embodiments, the conductive layer 110 may be a triangle or substantially triangular in shape. The conductive layer 110 may be a cross or substantially cross shaped. According to various embodiments, the conductive layer 110 may be formed into any shape that may be desired for a given application.

According to various embodiments, the conductive layer 110 may have a thickness in the range from about 1 μm to about 300 µm, e.g. in the range from about 10 µm to about 250 µm, e.g. in the range from about 25 µm to about 200 µm, e.g. in the range from about 50 µm to about 150 µm, e.g. in the range from about 75 µm to about 100 µm. According to various embodiments, the conductive layer 110 may have a thickness of at least about 1 µm, e.g. of at least about 10 µm, e.g. of at least about 25 µm, e.g. of at least about 50 µm, e.g. of at least about 75 µm. According to various embodiments, the conductive layer 110 may have a thickness of less than or equal to about 300 µm, e.g. of less than or equal to about 250 µm, e.g. of less than or equal to about 200 µm, e.g. of less than or equal to about 150 µm, e.g. of less than or equal to about 100 µm.

According to various embodiments, the conductive layer 110 may include or essentially consist of various metals, e.g. aluminum, silver, copper, nickel, and various alloys such as aluminum-silver and cupronickel. According to various embodiments, the conductive layer 110 may include or essentially consist of various semiconductor materials which may be doped such that they are electrically conductive, e.g. a polysilicon layer heavily doped with boron, phosphorus, or arsenic.

According to various embodiments, the suspended structure 106 may be configured to provide an electrostatic field between at least a portion of the suspended structure 106 and the carrier 102. The suspended structure 106 and the conductive layer 110 may be configured to provide the electrostatic field. The electrostatic field may be provided by changing a distance, D2, between the bottom surface 106b of the suspended structure 106 and conductive layer 110. According to various embodiments, the distance D2 measured when the suspended structure 106 is at rest may be in the range from about 1 µm to about 300 µm, e.g. in the range from about 10 µm to about 250 µm, e.g. in the range from about 25 µm to about 200 µm, e.g. in the range from about 50 µm to about 150 µm, e.g. in the range from about 75 µm to about 100 µm. According to various embodiments, the distance D2 measured when the suspended structure 106 is at rest may be at least about 1 µm, e.g. at least 10 µm, e.g. at least about 25 µm, e.g. at least about 50 µm, e.g. at least about 75 µm. According to various embodiments, the distance D2 measured when the suspended structure 106 is at rest may be less than or equal to about 300 µm, e.g. less than or equal to about 250 µm, e.g. less than or equal to about 200 µm, e.g. less than or equal to about 150 µm, e.g. less than or equal to about 100 µm.

According to various embodiments, the distance D2 measured when the suspended structure 106 is at rest may be formed by providing a sacrificial layer (not shown) between the bottom surface 106b of the suspended structure 106 and the top surface 102a of the carrier 102 during the manufacturing process of the sensor structure 100. According to various embodiments, the sacrificial layer may be removed through various by means of various etching techniques, e.g. isotropic gas phase etching, vapor etching, wet etching, isotropic dry etching, plasma etching, etc. According to various embodiments, the thickness of the sacrificial layer may determine the distance D2 and therefore the distance between the bottom surface 106b of the suspended structure 106 and the top surface 102a of the carrier 102.

According to various embodiments, the suspended structure 106 may be configured to change the distance D2 in response to an electrostatic force provided between a portion of the suspended structure 106 and the carrier 102. The electrostatic force may be provided by the conductive layer 110.

According to various embodiments, as illustrated in FIG. 1B, a portion of the suspended structure 106 may be configured as a plurality of finger-like structures 112. The finger-like structures 112 may be arranged along an edge region of the suspended structure 106. According to various embodiments, the finger-like structures 112 may be arranged along at least two edges of the suspended structure 106. The finger-like structures 112 may be fixed to a portion or portions of the top surface 108a of the mounting structure 108 and arranged between the mounting structure 108 and a central portion 114 of the suspended structure 106 which may be suspended over the opening 104.

According to various embodiments, the finger-like structures 112 may have a width, W1, which may be, e.g., in the range from about 5 µm to about 50 µm, e.g. in the range from about 5 µm to about 10 µm, e.g. in the range from about 10 µm to about 20 µm, e.g. in the range from about 20 µm to about 35 µm, e.g. in the range from about 35 µm to about 50 µm. According to various embodiments, the finger-like structures 112 may have a length, L1, which may be, e.g., in the range from about 50 µm to about 500 µm, e.g. in the range from about 50 µm to about 60 µm, e.g. in the range from about 60 µm to about 80 µm, e.g. in the range from about 80 µm to about 100 µm, e.g. in the range from about 100 µm to about 125 µm, e.g. in the range from about 125 µm to about 150 µm, e.g. in the range from about 150 µm to about 200 µm, e.g. in the range from about 200 µm to about 250 µm, e.g. in the range from about 250 µm to about 300 µm, e.g. in the range from about 300 µm to about 500 µm.

According to various embodiments, the finger-like structures 112 may include or essentially consist of the same material as the suspended structure 106. According to various embodiments, the finger-like structures and the suspended structure 106 may be (e.g. monolithically) integrally formed.

According to various embodiments, the central portion 114 of the suspended structure 106 may be square or substantially square in shape. According to various embodiments, the central portion 114 of the suspended structure 106 may be rectangular or substantially rectangular in shape. According to various embodiments, the central portion 114 of the suspended structure 106 may be a circle or substantially circular in shape. According to various embodiments, the central portion 114 of the suspended structure 106 may be an oval or substantially oval in shape. According to various embodiments, the central portion 114 of the suspended structure 106 may be a triangle or substantially triangular in shape. According to various embodiments, the central portion 114 of the suspended structure 106 may be a cross or substantially cross shaped. The central portion 114 of the suspended structure 106 may be formed into any shape that may be desired for a given application.

Figure 2A:
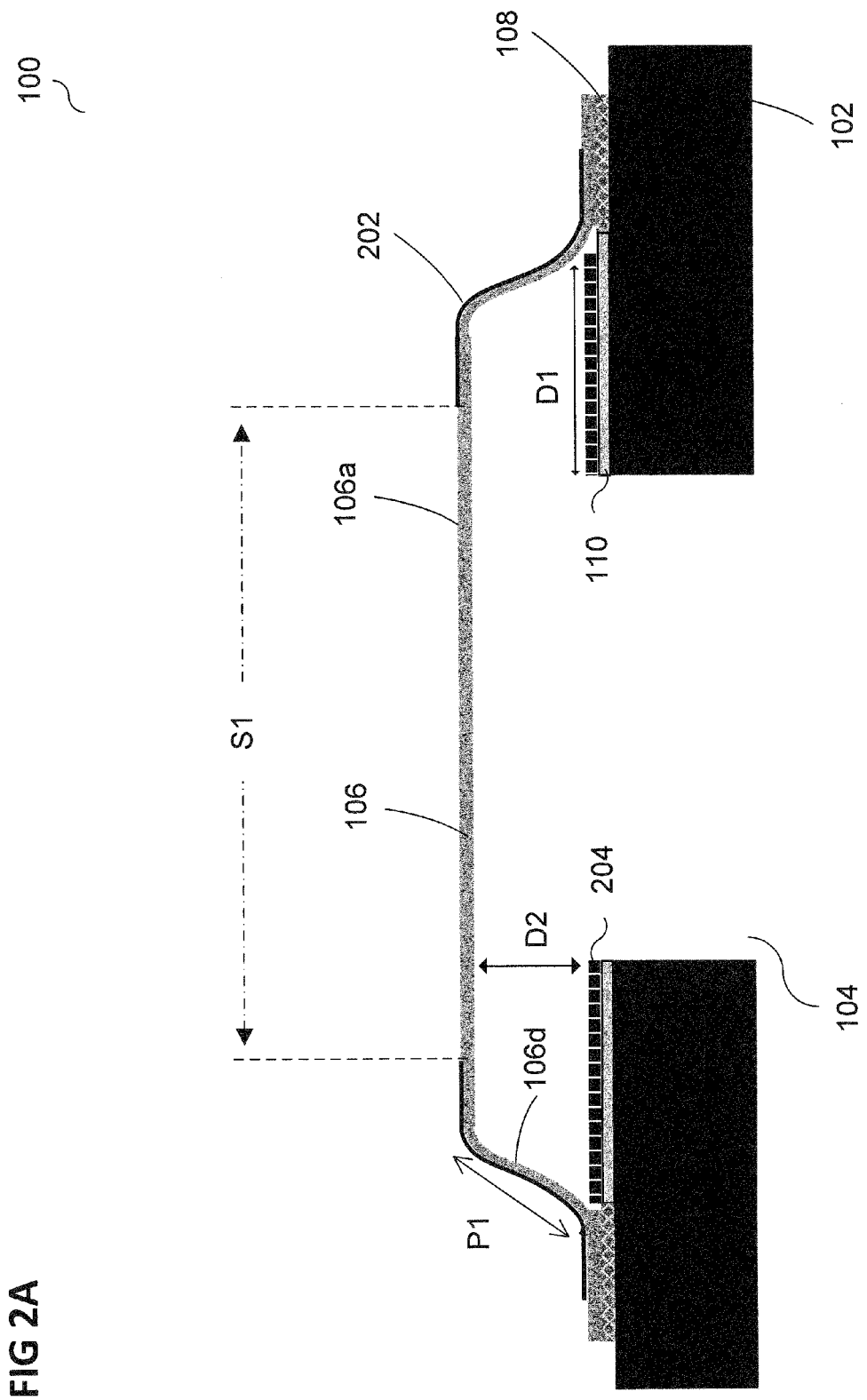
FIG. 2A shows a cross-sectional representation of a transducer structure in accordance with various embodiments.
Figure 2B:
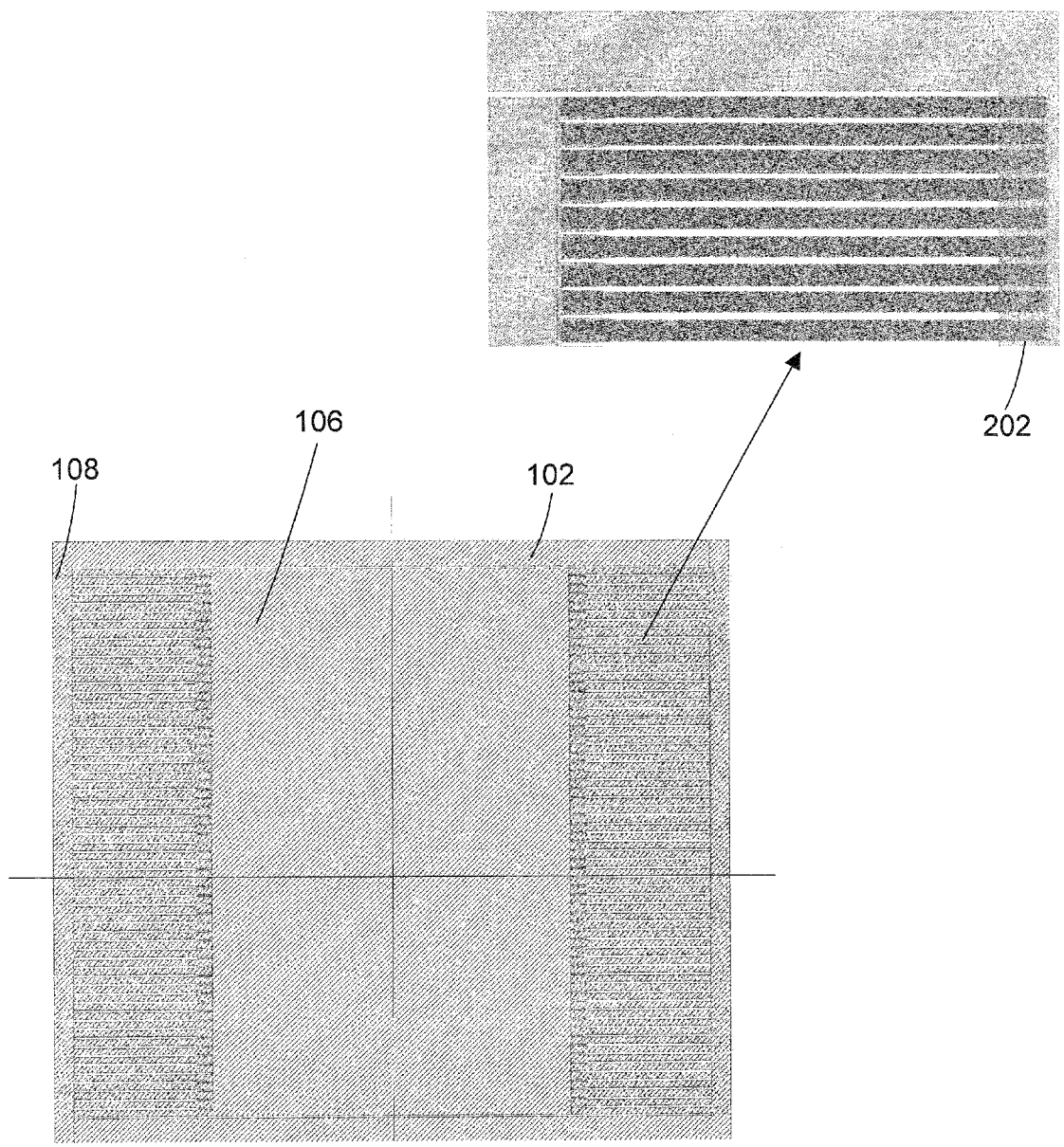
FIG. 2B shows an overhead representation of the transducer structure represented in FIG. 2A.

According to various embodiments, as illustrated in FIGS. 2A and 2B, the transducer structure 100 may include at least one tensioning structure 202. The at least one tensioning structure 202 may be implemented as a plurality of tensioning structures. According to various embodiments, the at least one tensioning structure 202 may be formed over a surface of the suspended structure 106. The at least one tensioning structure 202 may be formed over a portion of the top surface 106a of the suspended structure 106. According to various embodiments, the at least one tensioning structure 202 may be arranged over an edge region of the top surface 106a of the suspended structure 106. In other words the at least one tensioning structure 202 may be formed over a portion of the suspended structure 106 which may not overhang and/or extend over the opening 104 in the carrier 102. According to various embodiments, the at least one tensioning structure 202 may cause a portion of the suspended structure 106 to deflect and/or deform such that suspended structure 106 forms a canopy-like structure over a portion of the carrier 102 which may contain the opening 104. According to various embodiments, the tensioning structure 202 may cause a portion of the suspended structure 106 to deflect and assume a substantially sigmoid curve shape. A portion (denoted by the indicator S1) of the suspended structure 106 which may not be covered by the at least one tensioning structure 202 may remain substantially planar and parallel to the top surface 102a of the carrier 102. According to various embodiments, the portion S1 of the suspended structure 106 may deflect and/or oscillate due to an electrostatic force provided between the conductive layer 110 and the suspended structure 106.

According to various embodiments, the distance D2 measured when the suspended structure 106 is at rest may be implemented by forming the at least one tensioning structure 202 over a portion of the top surface 106a of the suspended structure 106. According to various embodiments, the at least one tensioning structure 202 may have a compressive residual stress which is substantially higher that a compressive residual stress of the suspended structure 106. According to various embodiments, the tensile residual stress of the at least one tensioning structure 202 may be, e.g., about 1 GPa, e.g. in the range from about 800 MPa to about 900 MPa; e.g. from about 900 MPa to about 1 GPa; e.g. from about 1 GPa to about 1.1 GPa; e.g. from about 1.1 GPa to about 1.2 GPa. According to various embodiments, the compressive residual stress of the at least one tensioning structure 202 may cause a portion of the suspended structure 106 to deflect and/or deform. This deflection may result in the suspended structure 106 assuming an arch-like structure similar to the structure depicted in FIG. 2A.

According to various embodiments, the transducer structure 100 may include an insulating layer 204 formed over conductive layer 110. The insulating layer 204 may prevent the conductive layer 110 from making physical and/or electrical contact with the suspended structure 106. According to various embodiments, the insulating layer 204 may include or essentially consist of various dielectrics, such as, for example, a silicon oxide, silicon nitride, tetraethyl orthosilicate, borophosphosilicate glass, and various plasma oxides. The insulating layer 204 may have a thickness in the range from about 1 nm to about 300 nm, e.g. in the range from about 10 nm to about 250 nm, e.g. in the range from about 25 nm to about 200 nm, e.g. in the range from about 50 nm to about 150 nm, e.g. in the range from about 75 nm to about 100 nm. The insulating layer 204 may have a thickness of at least about 1 nm, e.g. of at least about 10 nm, e.g. of at least about 25 nm, e.g. of at least about 50 nm, e.g. of at least about 75 nm. The insulating layer 204 may have a thickness of less than or equal to about 300 nm, e.g. of less than or equal to about 250 nm, e.g. of less than or equal to about 200 nm, e.g. of less than or equal to about 150 nm, e.g. of less than or equal to about 100 nm.

According to various embodiments, the at least one tensioning structure 202 may include or essentially consist of a semiconductor material such as, e.g. silicon. According to various embodiments, the at least one tensioning structure 202 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The at least one tensioning structure 202 may include or essentially consist of at least one of a metal, a dielectric material, a piezoelectric material, a piezoresistive material, and a ferroelectric material.

According to various embodiments, the at least one tensioning structure 202 may have a thickness in the range from about 1 µm to about 300 µm, e.g. in the range from about 10 µm to about 250 µm, e.g. in the range from about 25 µm to about 200 µm, e.g. in the range from about 50 µm to about 150 µm, e.g. in the range from about 75 µm to about 100 µm. According to various embodiments, the at least one tensioning structure 202 may have a thickness of at least about 1 µm, e.g. of at least about 10 µm, e.g. of at least about 25 µm, e.g. of at least about 50 µm, e.g. of at least about 75 µm. According to various embodiments, the at least one tensioning structure 202 may have a thickness of less than or equal to about 300 µm, e.g. less than or equal to about 250 µm, e.g. less than or equal to about 200 µm, e.g. less than or equal to about 150 µm, e.g. less than or equal to about 100 µm.

According to various embodiments, a portion, 106d, of the suspended structure 106 which may be deflected and/or deformed by the at least one tensioning structure 202 may have a length, P1. The distance P1 may be in the range from about 1 µm to about 300 µm, e.g. in the range from about 10 µm to about 250 µm, e.g. in the range from about 25 µm to about 200 µm, e.g. in the range from about 50 µm to about 150 µm, e.g. in the range from about 75 µm to about 100 µm. In various embodiments, the distance P1 may be at least about 1 µm, e.g. at least about 10 µm, e.g. at least about 25 µm, e.g. at least about 50 µm, e.g. at least about 75 µm. In various embodiments, the distance P1 may be less than or equal to about 300 µm, e.g. less than or equal to about 250 µm, e.g. less than or equal to about 200 µm, e.g. less than or equal to about 150 µm, e.g. less than or equal to about 100 µm.

According to various embodiments, the sacrificial layer may be removed through various through various etching techniques, e.g. isotropic gas phase etching, vapor etching, wet etching, isotropic dry etching, plasma etching, etc. According to various embodiments, the thickness of the sacrificial layer may determine the distance D2 and therefore the distance between the bottom surface 106b of the suspended structure 106 and the top surface 102a of the carrier 102.

Figure 3B:
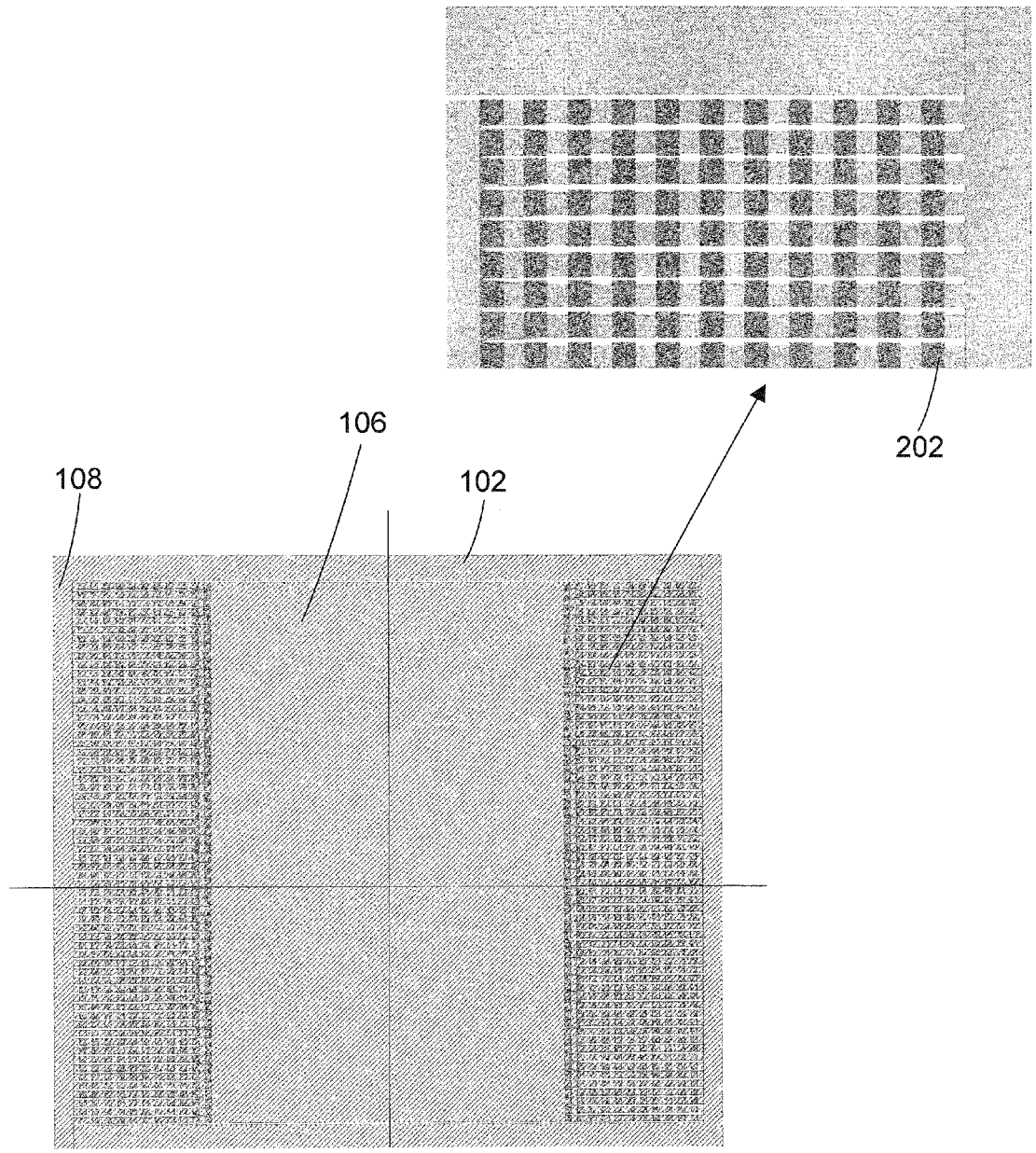
FIG. 3B shows an overhead representation of the transducer structure represented in FIG. 3A.

According to various embodiments, as illustrated in FIGS. 3A and 3B, the transducer structure 100 may include implementing at least a portion of the suspended structure 106 as a corrugated and/or sine wave-like structure. The corrugated shape of the suspended structure 106 may be achieved by implementing the at least one tensioning structure 202 as a plurality of tensioning structures arranged on the bottom surface 106b of the suspended structure 106. According to various embodiments, arranging a plurality of tensioning structures at regular intervals along the bottom surface 106b of the suspended structure 106 may cause localized portions of the suspended structure 106 to deflect and/or deform such that a corrugated shape may be achieved. According to various embodiments, by arranging the at least one tensioning structure 202 on the bottom surface 106b of the suspended structure 106 or alternatively, embedding them therein, it may be possible to control the way in which the suspended structure 106 will deform. According to various embodiments, by controlling the arrangement of the at least one tensioning structure 202, the suspended structure 106 may be shaped so that an edge region of the suspended structure 106 may assume a corrugated shape similar to the shape illustrated in FIG. 3A. According to various embodiments, by controlling the arrangement of the at least one tensioning structure 202, the central portion S1 of the suspended structure 106 may be separated and/or raised over the top surface 102a of the substrate 102. According to various embodiments, it may not be necessary for either the at least one tensioning structure 202 or the suspended structure 106 to be subjected to a compressive stress while the other is subjected to a tensile stress, i.e. it is not necessarily the case that the stresses in the two materials are of opposite sign and/or type. Rather, both the at least one tensioning structure 202 and the suspended structure 106 may be subjected to either a tensile stress or a compressive stress, provided that the magnitudes of the stresses are different. According to various embodiments, by controlling the arrangement of the at least one tensioning structure 202, the suspended structure 106 may be formed into various shapes, e.g. a substantially elliptical shape, an oval or oval-like shape, etc. According to various embodiments, by controlling the arrangement of the at least one tensioning structure 202, the suspended structure 106 may be formed into any shape that may be desirable for a given application.

According to various embodiments, one or more embodiments of the transducer structure 100 may be implemented in a wide range MEMS (micro-electro-mechanical system) actuators and/or sensors, where the term "wide range" refers to the driving range of the transducer, i.e. the possible displacement of a membrane structure and/or to the dynamic range of the transducer. According to various embodiments, the sensor structure 100 may be provided to implement in various applications for sensors/actuators that need a wide driving range, for example, microphones with high linearity requirements at larger displacements resulting from high sound pressure levels.

According to various embodiments, the transducer structure 100 may include a micro-mirror structure (not shown) arranged on a portion of the top surface 106 of the suspended structure 106. According to various embodiments, the transducer structure 100 may include a lens structure (not shown) arranged on a portion of the top surface 106 of the suspended structure 106. This lens structure may be part of a micro-camera structure.

According to various embodiments, the transducer structure 100 may be implemented as a micro-electro-mechanical system (MEMS) microphone. According to various embodiments where the transducer structure 100 may be implemented as a microphone, the suspended structure 106 may be displaced and/or deflected by air pressure variations. This displacement may lead to a changed in the distance, D2, between the bottom surface 106b of the suspended structure 106 and the conductive layer 110. The change in the distance, D2, may cause a change in the electrical capacitance between the suspended structure 106 and the conductive layer 110. According to various embodiments, the electrical capacitance between the suspended structure 106 and the conductive layer 110 may be, e.g., in the range from about 1 pF to about 10 pF; e.g. from about 1 pF to about 2 pF; e.g. from about 2 pF to about 3 pF; e.g. from about 3 pF to about 4 pF; e.g. from about 4 pF to about pF; e.g. from about 4 pF to about 5 pF; e.g. from about 5 pF to about 10 pF.

According to various embodiments, the transducer structure 100 may be implemented as a MEMS speaker structure. According to various embodiments where the transducer structure 100 may be implemented as a speaker, an electric voltage may be formed between a portion of the suspended structure 106 and the conductive layer 110. This electric voltage may cause the suspended structure 106 to deflect in the direction toward the substrate 102. According to various embodiments, the electric voltage between the suspended structure 106 and the conductive layer 110 may be manipulated in order to cause the suspended structure 106 to oscillate at a given frequency or combination of frequencies as may be desirable for a given application.

According to various embodiment, the electric voltage between the suspended structure 106 and the conductive layer 110 may be may be, e.g., in the range from about 10 V to about 100 V, e.g. from about 10 V to about 15 V; e.g. from about 15 V to about 20 V; e.g. from about 20 V to about 25 V; e.g. from about 25 V to about 50 V; e.g. from about 50 V to about 100 V.

Figure 4A:
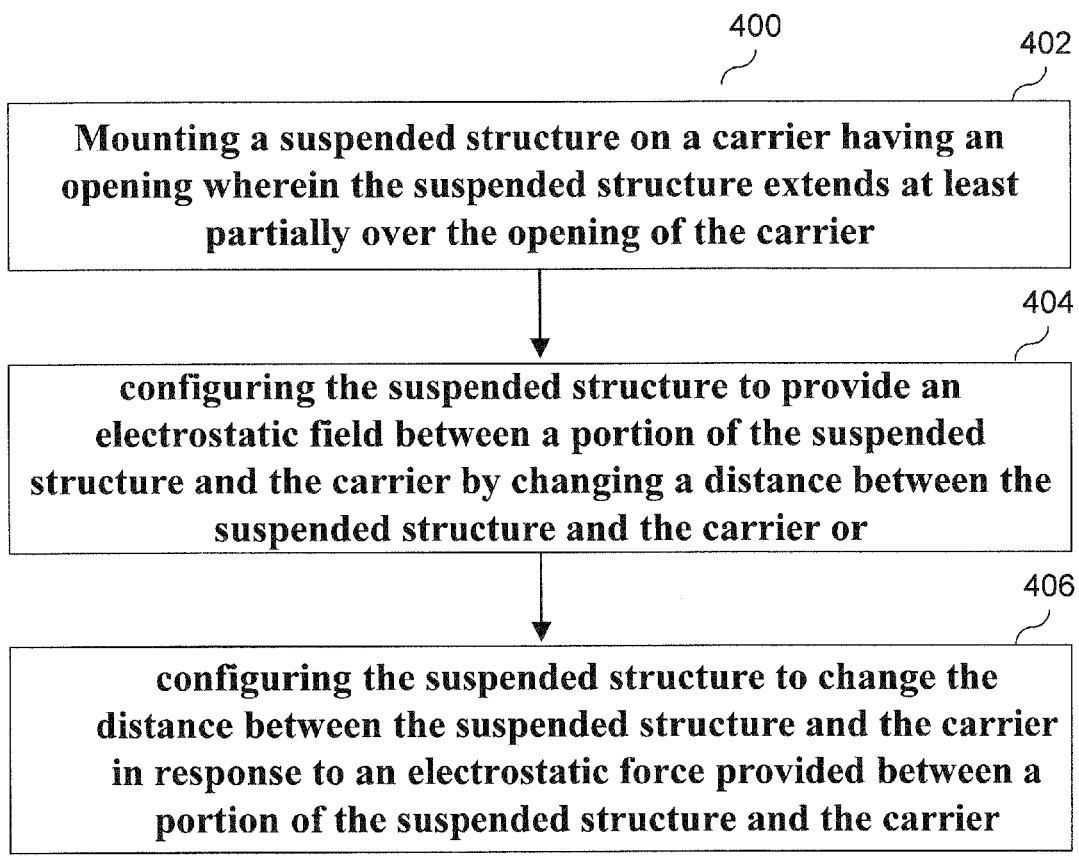
Figure 4B:
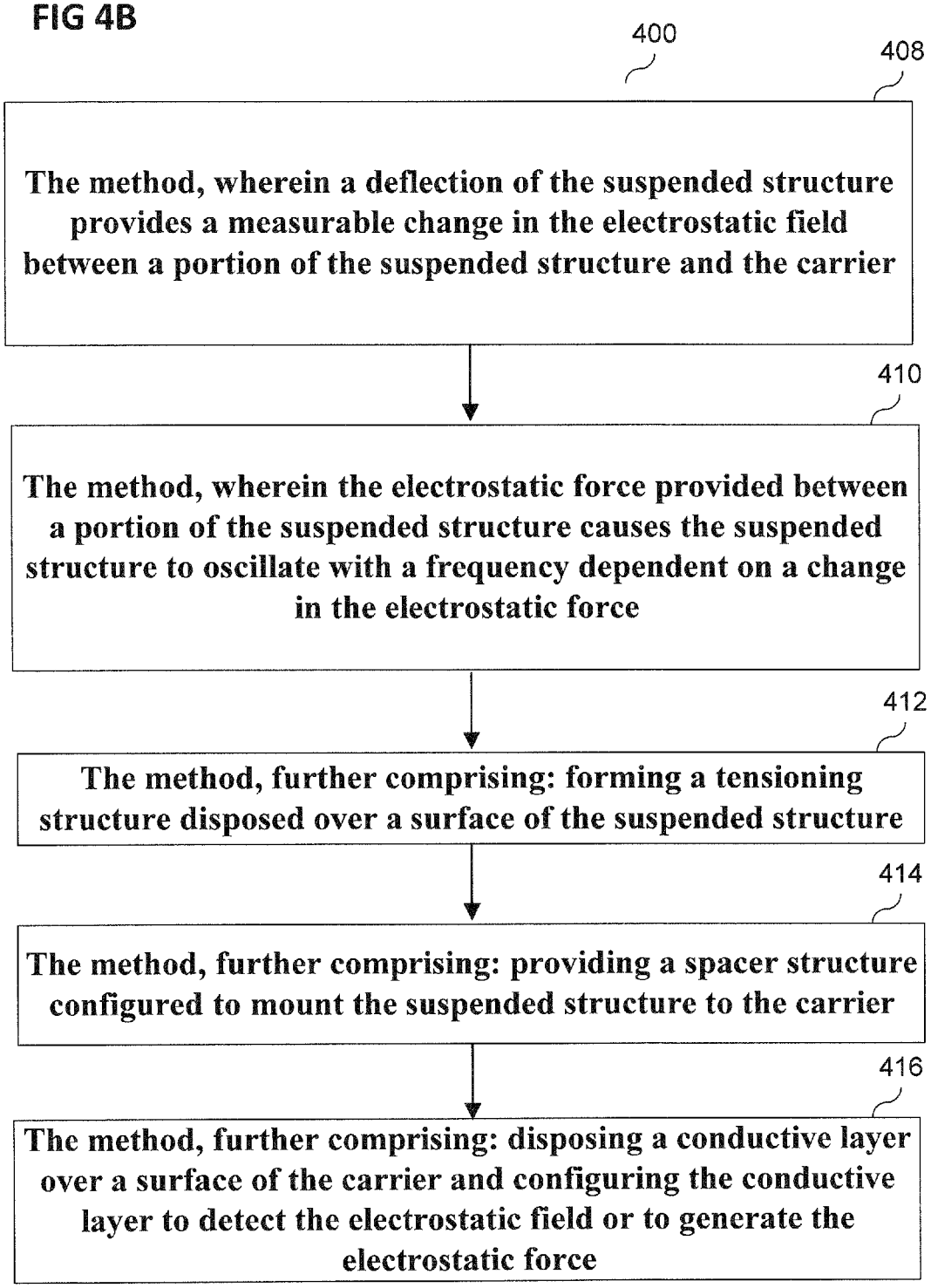

According to various embodiments, the suspended structure may oscillate at a frequency, e.g., in a range near static deflection to a range near the resonance frequency which may be e.g. about 20 kHz. According to various embodiments, as illustrated in FIGS. 4A-4C, a method 400 of forming a transducer structure is disclosed. The method 400 may include, as shown in 402, mounting a suspended structure on a carrier having an opening wherein the suspended structure extends at least partially over the opening of the carrier. The method 400 may further include, as shown in 404, configuring the suspended structure to provide an electrostatic field between a portion of the suspended structure and the carrier by changing a distance between the suspended structure and the carrier or, as shown in 406, configuring the suspended structure to change the distance between the suspended structure and the carrier in response to an electrostatic force provided between a portion of the suspended structure and the carrier. According to various embodiments, as shown in 408, a deflection of the suspended structure may provide a measurable change in the electrostatic field between a portion of the suspended structure and the carrier. According to various embodiments, as shown in 410, the electrostatic force provided between a portion of the suspended structure may cause the suspended structure to oscillate with a frequency dependent on a change in the electrostatic force. According to various embodiments, the method 400 may further include, as shown in 412, forming a tensioning structure disposed over a surface of the suspended structure. According to various embodiments, the method 400 may further include, as shown in 414, providing a spacer structure configured to mount the suspended structure to the carrier. According to various embodiments, the method 400 may further include, as shown in 416, disposing a conductive layer over a surface of the carrier and configuring the conductive layer to detect the electrostatic field or to generate the electrostatic force. According to various embodiments, the method 400 may further include, as shown in 418, forming at least one void through a portion of the suspended structure; wherein the at least one void does not extend through a central portion of the suspended structure. In various embodiments, as shown in 420, the tensioning structure may be configured to cause a portion of the suspended structure containing the at least one void to deflect such that the suspended structure forms an arch-like structure over the carrier. In various embodiments, as shown in 422, the tensioning structure may be configured to cause a portion of the suspended structure containing the at least one void to deflect in a substantially sine-wave shape. In various embodiments, as shown in 424, the central portion of the suspended structure may be arranged over and substantially parallel to the opening of the carrier.

According to various embodiments, a transducer structure is disclosed. The transducer structure may include a carrier implemented as a non-suspended electrode; a suspended structure mounted on the carrier and extending at least partially over the non-suspended electrode. According to various embodiments, the suspended structure may include or may be implemented as a suspended electrode. According to various embodiments, the non-suspended electrode and the suspended electrode may be configured to provide and electrostatic force between the non-suspended electrode and the suspended electrode to change the distance between the suspended structure and the carrier. According to various embodiments, the non-suspended electrode and the suspended electrode may be configured to change the distance between the non-suspended electrode and the suspended electrode in response to a change in an electrostatic force provided between the non-suspended electrode and the suspended electrode. According to various embodiments, the transducer structure may further include an opening formed through a portion of the carrier. In various embodiments, at least a portion of the suspended structure may extend at least partially over the opening in the carrier. According to various embodiments, the transducer structure may further include a tensioning structure disposed over a surface of the suspended structure and configured to cause a deflection of the suspended structure in at least a first direction. According to various embodiments, the transducer structure may further include a spacer structure configured to mount the suspended structure to the carrier. According to various embodiments, the transducer structure may further include a conductive layer disposed over a surface of the carrier and arranged to detect the electrostatic field or to generate the electrostatic force. In various embodiments, the suspended structure may be implemented as a diaphragm structure. In various embodiments, the suspended structure may be implemented as a membrane structure. According to various embodiments, the carrier may be implemented as a micro-electro-mechanical system. According to various embodiments, the transducer structure may further include at least one void formed through a portion of the suspended structure. In various embodiments, the at least one void may be arranged at an edge region of the suspended structure. According to various embodiments, the tensioning structure may be configured to cause a portion of the suspended structure containing the at least one void to deflect such that the suspended structure forms an arch-like structure over the carrier. According to various embodiments, the tensioning structure may be configured to cause a portion of the suspended structure containing the at least one void to cause the portion of the suspended structure to deflect in a substantially sine-wave shape. According to various embodiments, the at least one void may not extend through a central portion of the suspended structure. In various embodiments, the central portion of the suspended structure may be disposed over and substantially parallel to the opening of the carrier.

According to various embodiments, a transducer structure is provided. The transducer structure may include a carrier having an opening; a suspended structure mounted on the carrier and extending at least partially over the opening of the carrier; where the suspended structure is configured to provide an electrostatic field between a portion of the suspended structure and the carrier by changing a distance between the suspended structure and the carrier; or where the suspended structure is configured to change the distance between the suspended structure and the carrier in response to an electrostatic force provided between a portion of the suspended structure and the carrier.

According to various embodiments, the transducer structure may further include a tensioning structure disposed over a surface of the suspended structure and configured to cause a deflection of the suspended structure in at least a first direction. According to various embodiments, the transducer structure may further include a spacer structure configured to mount the suspended structure to the carrier. The transducer structure may further include a conductive layer disposed over a surface of the carrier and arranged to detect the electrostatic field or to generate the electrostatic force. According to various embodiments, the suspended structure may be implemented as a membrane structure. The carrier may be implemented as a micro-electro-mechanical system. The transducer structure may further include at least one void formed through a portion of the suspended structure. According to various embodiments, the at least one void is arranged at an edge region of the suspended structure. The tensioning structure may be configured to cause a portion of the suspended structure containing the at least one void to deflect such that the suspended structure forms an arch-like structure over the carrier. Furthermore, the tensioning structure may be configured to cause a portion of the suspended structure containing the at least one void to cause the portion of the suspended structure to deflect in a substantially sine-wave shape. According to various embodiments, the at least one void may not extend through a central portion of the suspended structure. According to various embodiments, the central portion of the suspended structure may be disposed over and substantially parallel to the opening of the carrier.

According to various embodiments a transducer structure is disclosed. The transducer structure may include a carrier; a suspended structure mounted on the carrier; and a tensioning structure disposed over a surface of the suspended structure and configured to cause a deflection of the suspended structure in at least a first direction. According to various embodiments, the suspended structure may be configured to provide an electrostatic field between at least a portion of the suspended structure and the carrier by changing a distance between the suspended structure and the carrier. According to various embodiments the suspended structure may be configured to change the distance between the suspended structure and the carrier in response to an electrostatic force provided between a portion of the suspended structure and the carrier. According to various embodiments, the transducer structure may further include an opening formed through a portion of the carrier. In various embodiments, at least a portion of the suspended structure may extend over the opening in the carrier. According to various embodiments, the transducer structure may further include a conductive layer disposed over a surface of the carrier and arranged to detect the electrostatic field or to generate the electrostatic force. According to various embodiments, the transducer structure may further include at least one void formed through a portion of the suspended structure. In various embodiments, the tensioning structure may be configured to cause a portion of the suspended structure containing the at least one void to deflect such that the suspended structure forms an arch-like structure over the carrier. In various embodiments, the tensioning structure may be configured to cause a portion of the suspended structure containing the at least one void to cause the portion of the suspended structure to deflect in a substantially sine-wave shape.

According to various embodiments, a method of operating a transducer structure is provided. The method may include mounting a suspended structure on a carrier having an opening wherein the suspended structure extends at least partially over the opening of the carrier. The suspended structure is configured to provide an electrostatic field between a portion of the suspended structure and the carrier by changing a distance between the suspended structure and the carrier. As an alternative, the suspended structure is configured to change the distance between the suspended structure and the carrier in response to an electrostatic force provided between a portion of the suspended structure and the carrier.

According to various embodiments of the method an incident pressure wave on the suspended structure may create a deflection of the suspended structure and may provide a measurable change in the electrostatic field between a portion of the suspended structure and the carrier. The electrostatic force provided between a portion of the suspended structure may cause the suspended structure to oscillate with a frequency dependent on a change in the electrostatic force. The method may further include forming a tensioning structure disposed over a surface of the suspended structure. According to various embodiments, the method may further include providing a spacer structure configured to mount the suspended structure to the carrier. According to various embodiments, the method may further include disposing a conductive layer over a surface of the carrier and configuring the conductive layer to detect the electrostatic field or to generate the electrostatic force. According to various embodiments, the method may further include forming at least one void through a portion of the suspended structure; where the at least one void does not extend through a central portion of the suspended structure. Furthermore, the tensioning structure may be configured to cause a portion of the suspended structure containing the at least one void to deflect such that the suspended structure forms an arch-like structure over the carrier. The tensioning structure may be configured to cause a portion of the suspended structure containing the at least one void to deflect in a substantially sine-wave shape. According to various embodiments, the central portion of the suspended structure may be arranged over and substantially parallel to the opening of the carrier.

While the invention has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A transducer structure, comprising:
  a carrier comprising a non-suspended electrode;
  a suspended structure mounted on the carrier and extending at least partially over the non-suspended electrode, the suspended structure comprising at least a suspended electrode;
  at least one void formed through a portion of the suspended structure;
  wherein the non-suspended electrode and the suspended electrode are configured to provide an electrostatic force between the non-suspended electrode and the suspended electrode to change the distance between the suspended structure and the carrier; or wherein the non-suspended electrode and the suspended electrode are configured to change the distance between the non-suspended electrode and the suspended electrode in response to a change in an electrostatic force provided between the non-suspended electrode and the suspended electrode, and
  a tensioning structure, wherein the tensioning structure is configured to cause a portion of the suspended structure containing the at least one void to deflect such that the suspended structure forms an arch-like structure over the carrier.

2. The transducer structure of claim 1, further comprising: an opening formed through a portion of the carrier.

3. The transducer structure of claim 2, wherein at least a portion of the suspended structure extends over the opening in the carrier.

4. The transducer structure of claim 1, further comprising: a tensioning structure disposed over a surface of the suspended structure and configured to cause a deflection of the suspended structure in at least a first direction.

5. The transducer structure of claim 1, further comprising: a spacer structure configured to mount the suspended structure to the carrier.

6. The transducer structure of claim 1, further comprising: a conductive layer disposed over a surface of the carrier and arranged to detect the electrostatic field or to generate the electrostatic force.

7. The transducer structure of claim 1, wherein the suspended structure comprises a diaphragm structure.

8. The transducer structure of claim 1, wherein the carrier comprises a micro-electro-mechanical system.

9. The transducer structure of claim 1, wherein the at least one void is arranged at an edge region of the suspended structure.

10. The transducer structure of claim 1, wherein the at least one void does not extend through a central portion of the suspended structure.

11. The transducer structure of claim 10, wherein the central portion of the suspended structure is disposed over and substantially parallel to an opening formed through a portion of the carrier.

12. A transducer structure, comprising:
  a carrier;
  a suspended structure mounted on the carrier;
  at least one void formed through a portion of the suspended structure; and
  a tensioning structure disposed over a surface of the suspended structure and configured to cause a deflection of the suspended structure in at least a first direction;
  wherein the suspended structure is configured to provide an electrostatic field between at least a portion of the suspended structure and the carrier by changing a distance between the suspended structure and the carrier; or wherein the suspended structure is configured to change the distance between the suspended structure and the carrier in response to an electrostatic force provided between a portion of the suspended structure and the carrier, and
  wherein the tensioning structure is configured to cause a portion of the suspended structure containing the at least one void to deflect such that the suspended structure forms an arch-like structure over the carrier.

13. The transducer structure of claim 12, further comprising:
   an opening formed through a portion of the carrier.

14. The transducer structure of claim 13,
   wherein at least a portion of the suspended structure extends over the opening in the carrier.

15. The transducer structure of claim 12, further comprising:
   a conductive layer disposed over a surface of the carrier and arranged to detect the electrostatic field or to generate the electrostatic force.

16. A transducer structure, comprising:
   a carrier comprising a non-suspended electrode;
   a suspended structure mounted on the carrier and extending at least partially over the non-suspended electrode, the suspended structure comprising at least a suspended electrode;
   at least one void formed through a portion of the suspended structure;
   a tensioning structure, wherein the tensioning structure is configured to cause a portion of the suspended structure containing the at least one void to cause the portion of the suspended structure to deflect in a substantially sine-wave shape;
   wherein the non-suspended electrode and the suspended electrode are configured to provide an electrostatic force between the non-suspended electrode and the suspended electrode to change the distance between the suspended structure and the carrier; or wherein the non-suspended electrode and the suspended electrode are configured to change the distance between the non-suspended electrode and the suspended electrode in response to a change in an electrostatic force provided between the non-suspended electrode and the suspended electrode.

17. A transducer structure, comprising:
   a carrier;
   a suspended structure mounted on the carrier;
   at least one void formed through a portion of the suspended structure; and
   a tensioning structure disposed over a surface of the suspended structure and configured to cause a deflection of the suspended structure in at least a first direction;
   wherein the suspended structure is configured to provide an electrostatic field between at least a portion of the suspended structure and the carrier by changing a distance between the suspended structure and the carrier; or wherein the suspended structure is configured to change the distance between the suspended structure and the carrier in response to an electrostatic force provided between a portion of the suspended structure and the carrier, and
   wherein the tensioning structure is configured to cause a portion of the suspended structure containing the at least one void to cause the portion of the suspended structure to deflect in a substantially sine-wave shape.

* * * * *